US006937965B1

(12) United States Patent
Bilak et al.

(10) Patent No.: US 6,937,965 B1
(45) Date of Patent: Aug. 30, 2005

(54) STATISTICAL GUARDBAND METHODOLOGY

(75) Inventors: Mark R. Bilak, Burlington, VT (US); Joseph M. Forbes, Westford, VT (US); Curt Guenther, Essex Junction, VT (US); Michael J. Maloney, Waterbury Center, VT (US); Michael D. Maurice, Jericho, VT (US); Timothy J. O'Gorman, Williston, VT (US); Regis D. Parent, Underhill, VT (US); Jeffrey S. Zimmerman, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/520,257

(22) Filed: Mar. 7, 2000

Related U.S. Application Data

(60) Provisional application No. 60/172,198, filed on Dec. 17, 1999.

(51) Int. Cl.$^7$ ................................................. G06F 7/60
(52) U.S. Cl. ..................... 703/2; 703/1; 703/6; 703/13; 703/14; 703/22; 700/39; 700/51; 700/52; 700/108; 700/109; 700/110; 702/80; 702/81; 702/82; 702/83; 702/84; 702/178; 702/179; 702/181; 702/182; 702/186; 706/12; 713/100; 714/33
(58) Field of Search ...................... 703/1, 2, 13, 22, 703/6, 14, 39, 51, 52, 108–110; 706/12; 713/100; 714/33; 702/80–84, 178, 179, 181, 182, 186

(56) References Cited

U.S. PATENT DOCUMENTS

| 5,634,001 | A  | * | 5/1997 | Mittl et al. .................... 714/33 |
| 6,226,741 | B1 | * | 5/2001 | Shen et al. ................. 713/100 |
| 6,356,861 | B1 | * | 3/2002 | Singhal et al. ................. 703/2 |

OTHER PUBLICATIONS

Kreyszig, "Advanced Engineering Mathematics", John Wiley & Sons, 1988, pp. 1248-1253.*
Comard et al., "Calculating Error of Measurement on High Speed Microprocessor Test", Proceedings of International Test Conference, Oct. 1994, pp. 793-801.*
Richard H. Williams, Charles F. Hawkins The Effect of Guardbands on Errors in Production Testing Mar. 1993, pp. 2-7 ; 0-8186-3360—Mar. 1993 @ 1993 IEEE Electrical and Computer Engineering Dept. The University of New Mexico, Albuquerque, NM 87131.
Richard H. Williams, Chareles F. Hawkins The Economics of Guardband Placement Aug. 1993, pp. 218-225; 0-7803-1429-8/93 Internation Test Conference 1993 Electrical and Computer Engineering Dept. The University of New Mexico, Albuquerque, NM 87131.

* cited by examiner

Primary Examiner—Thai Phan
Assistant Examiner—Herng-der Day
(74) Attorney, Agent, or Firm—Richard M. Kotulak

(57) ABSTRACT

A method for creating a guardband that incorporates statistical models for test environment, system environment, tester-to-system offset and reliability into a model and then processes a final guardband by factoring manufacturing process variation and quality against yield loss.

6 Claims, 7 Drawing Sheets

STATISTICAL GUARDBAND METHODOLOGY

CROSS REFERENCE TO RELATED APPLICATIONS

This application is based on Provisional Application No. 60/172,198, filed on Dec. 17, 1999.

FIELD OF THE INVENTION

This invention relates to methods and systems used to develop guardbands for assessing product specifications. More particularly it relates to methods and systems for developing guardbands for integrated circuits such as processors which are subject to manufacturing, testing and environmental performance variations.

BACKGROUND OF THE INVENTION

Guardbands are typically used in manufacturing to protect against product and process specification variations. However, if a manufacturer is too conservative in setting the guardband the amount of good products that fail testing is increased. If the guardband is too narrow, the products that go to customers may not function as specified. Two articles that discuss guardbands and the tradeoffs due to guardband placement are *The Economics of Guardband Placement*, Richard Williams and Charles Hawkins, International Test Conference 1993 and *The Effect of Guardbands on Errors in Production Testing*, Richard Williams and Charles Hawkins, International Test Conference 1993.

Products, especially, integrated circuits, are designed to be used in a number of applications. Each application often provides a somewhat different set of operating conditions. To insure that the product can work in each of these applications, manufacturing tests must be created to test both for these operating components and the surrounding impact of system components. This could involve a number of variables and parameters. One of the most important variables for processors is the speed which the processor operates in its system environment. Semiconductor manufacturers are constantly changing their designs, application conditions and processes to get faster processors.

Guardbands are determined today in a variety of ways. The easiest approach in developing guardbands is to develop tests that provide for the worst case of every variable. Other approaches include incorporating one of the variables mentioned above (usually test related variables) into determining a guardband, guardbanding reliability wear out mechanisms only, choosing a guardband to satisfy yield targets or not using a guardband at all. For many products, especially integrated circuits that are processors, establishing a guardband using these approaches can lead to sub optimal results.

SUMMARY OF THE INVENTION

Current approaches of setting the same guardband across speed sorts, guardbanding to worst case application conditions, and ignoring other variables, ends up lowering yields, providing fewer high frequency integrated circuits, and more lower frequency circuits. It is an object of this invention to provide a method of establishing a product specification guardband that treats variables statistically and allows risk level to dictate the appropriate guardbands.

This invention is a method and system for determining product specification guardbands that first develops models of each variable that influences the product specification, such as: test environment, the test environment to system environment differences, system environment and reliability by incorporating these variables into a statistical representation of each. The models are then input into a statistical program which performs a Monte Carlo analysis or analytical analysis (by convolving statistical distributions) to determine the correct specification guardbands.

DESCRIPTION OF PREFERRED EMBODIMENT(S)

Figure 1:
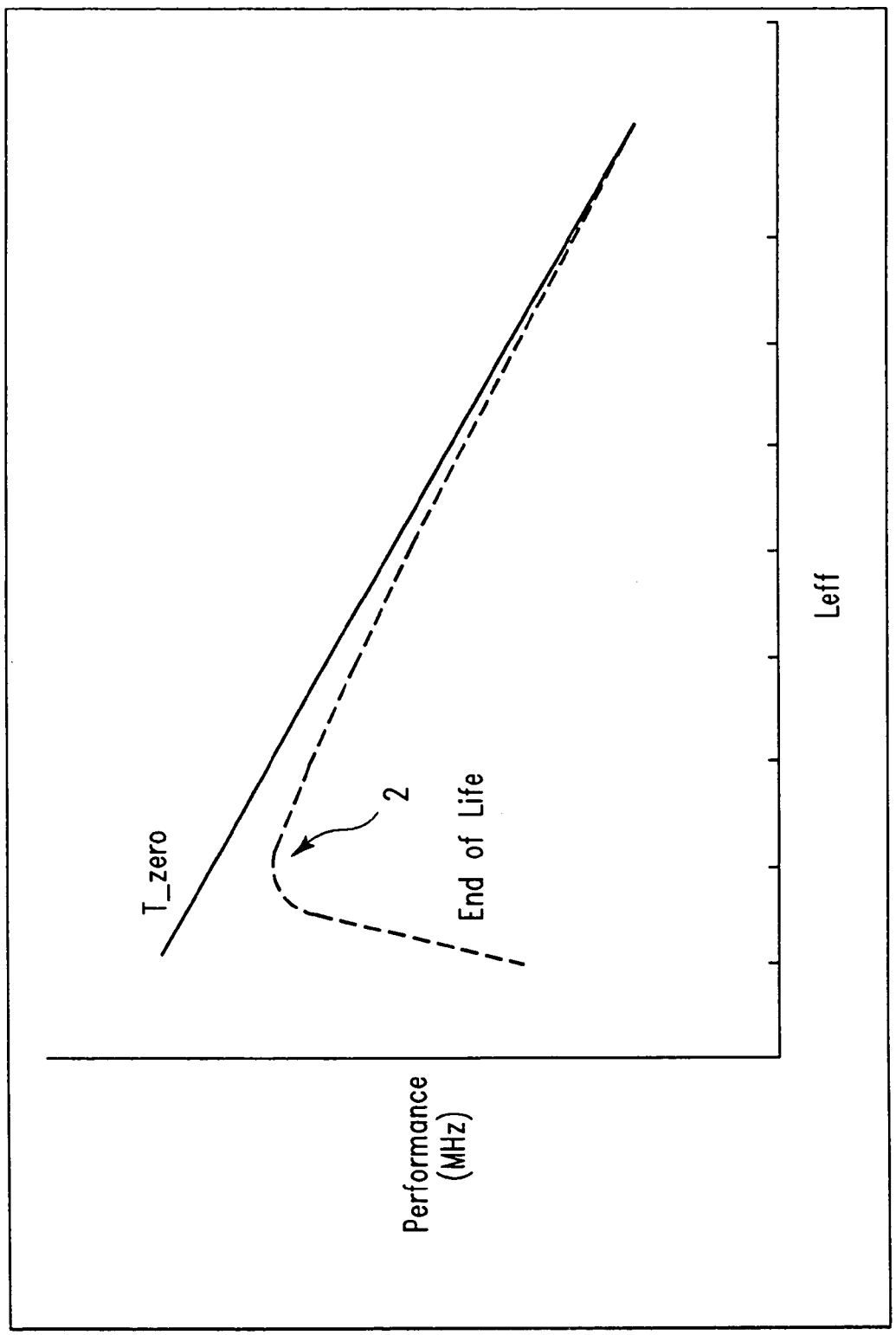
FIG. 1 is a performance-distribution plot of an integrated circuit.

Determining final product specification guardbands are often the least considered items of product development. Yet the guardbands chosen can, and often do, have a major effect on product quality, revenue and yield. This is especially true when "deep sorts" exist. See the upper tail of the product performance-distribution plot of FIG. 1. Many factors compound the deep sort guardband complexity, and guardband choice may eliminate sort based on small area at tail 2 of the distribution. A slight change in guardband can affect a large portion of parts due to large area under performance distribution curve of FIG. 1. Yet customers desire the highest performing parts. Slower performing parts are usually less susceptible to reliability mechanisms.

This invention incorporates market sector tolerance targets (quality and reliability) and models representing key variables that affect the product in the target market sector. It then uses these factors to produce a final product specification guardband using a Monte Carlo analysis. For the described embodiment, these variables are: tester environment, system environment, system-to-tester offset and reliability wearout mechanisms. Each statistical model will first be described followed by the description of the overall method and system.

Product performance or maximum frequency (FMAX) will be used to describe the invention because it is a critical specification in described embodiment which is built around the testing of integrated circuits, particularly processors. However it should be obvious to those skilled in the art that this methodology could be applied to other product specification such as but not limited to: the minimum/maximum operating voltage of a product, the minimum/maximum operating temperature of a product, minimum/maximum operating power of a product, minimum/maximum sleep mode power of a product, access time for memory products, or any key product specification.

For processors, FMAX, the maximum frequency that the integrated circuit will operate in the system environment, is important in terms of the application and price at which the processor will be sold. As a result of process variation, each processor has a different FMAX. Measuring FMAX and sorting a processor by performance is accomplished by running a set of functional test patterns at the desired sort frequencies. A processor is binned at the highest sort frequency in which all patterns function. Generally, the FMAX of the processor as measured on a tester is faster than the FMAX of the processor as measured in a system.

The tester environment is one input to the guardband model. Tester characterization involves quantifying those variables that may contribute to inaccuracies in a product specification (i.e. FMAX) measurement on a tester. These include contributions such as: tester timing accuracy, clock edge placement accuracy, power supply distribution, temperature distribution and tester-to-tester offset. The error in FMAX can be broken up into two components, one mechanical and one electrical. The mechanical component contains the DIB (device under test interface board) and handler, and the electrical component focuses on the pin electronics of the tester. Both components add to the inaccuracy in the FMAX measurement. The FMAX errors are then characterized, and a model is developed using a statistical programming tool. SAS by SAS Institute, Inc., a commercially available statistical programming tool, is suitable for such use, but other programs could be used as well (i.e. MATLAB by Mathworks, Inc., MATHCAD by MathSoft, Inc., etc.).

System environment characterization involves quantifying those variables that may contribute to inaccuracies or anomalies in a product specification (i.e. FMAX) in a system. These include such application conditions as compatibility with different components, assessing effects of manufacturing process variation, temperature variation, power supply variation and noise margin.

Figure 3:
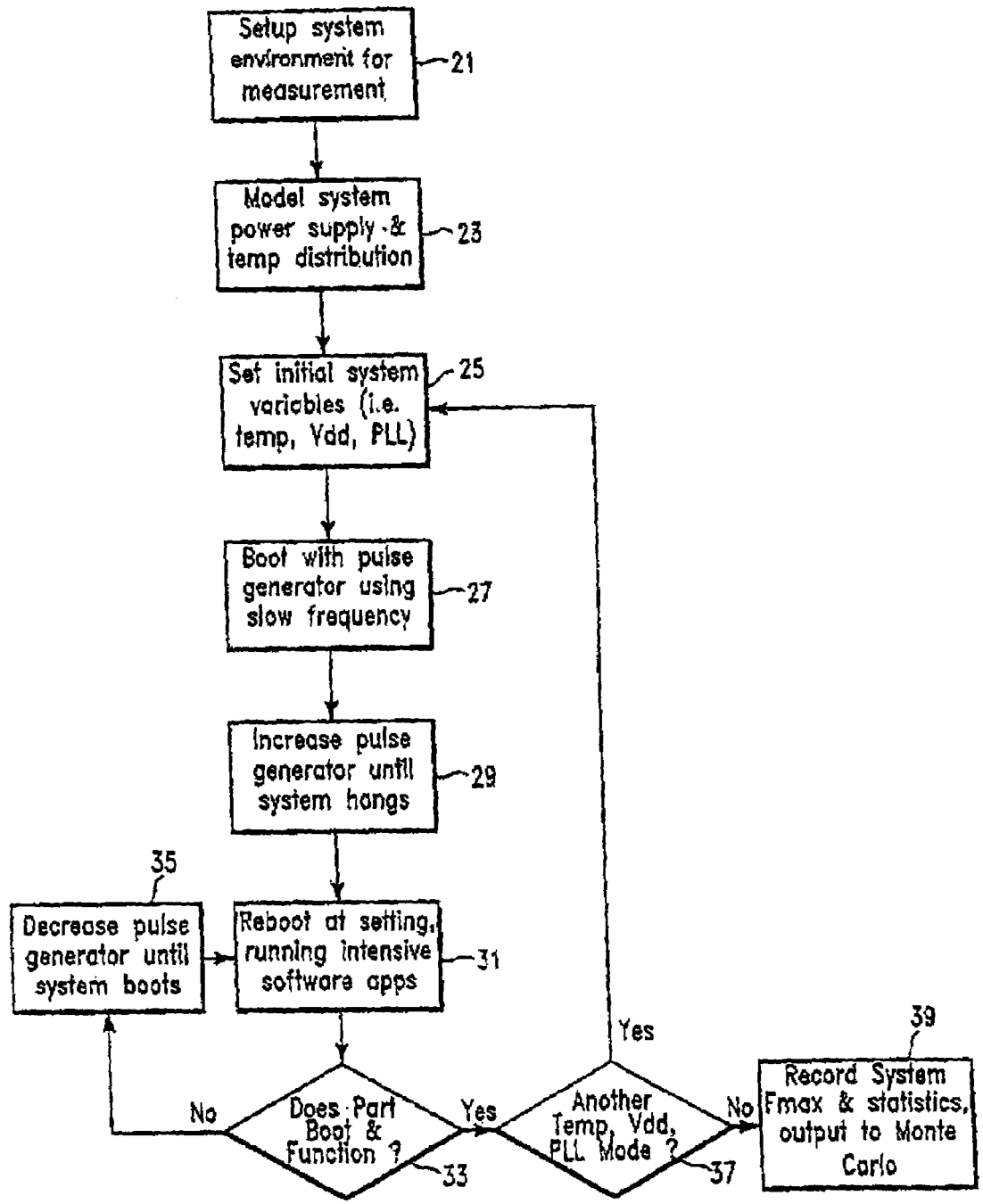
FIG. 3 is a flowchart illustrating the process for obtaining the model for the system environment.
Figure 4:
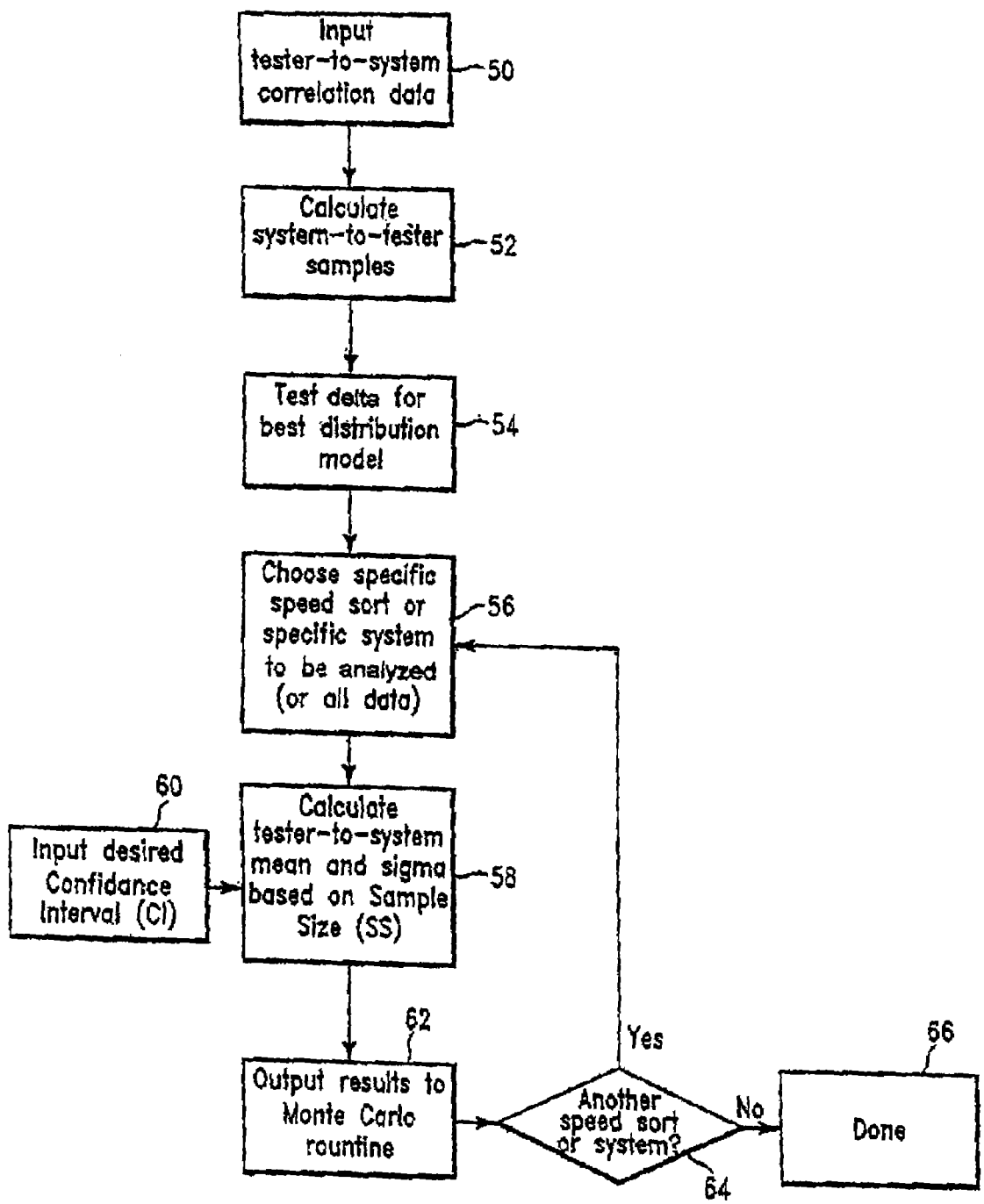
FIG. 4 is a flowchart illustrating how the system to tester offset is generated.

In FIG. 3 the process for obtaining the model for the system environment is illustrated. In order to obtain the data for this characterization various system environments are setup at step 21 for product measurements. A typical setup would include a means of varying system frequency (i.e. external oscillator), a means of varying power supply voltage (i.e. voltage regulator), temperature controller (i.e. Peltier device) and a means of inserting various samples into the same board (i.e. a socket). Since not all parts run at their specified voltage/temperature, system power supply and temperature are statistically modeled at step 23 using various samples under normal operating conditions. These models provide a means of predicting a particular voltage and temperature value for any given processor operating at any given time. Next at step 25, the system is initialized (desired operating temperature, voltage and PLL mode are selected). The variable oscillator is then set to a low value and at step 27 the processor is booted at a slow frequency. At step 29 the frequency of the oscillator is increased in fixed intervals until the system no longer boots. The processor is rebooted at the frequency the system hanged. If the system boots, it is exercised using an intensive and comprehensive suite of software packages. If the processor could not run the complete software suit successfully, the oscillator frequency is lowered at step 35 until the processor boots and the software verification testing at step 31 is repeated. If the processor booted and ran all software without hanging, the FMAX is recorded at step 33. This process is repeated at step 37 for another voltage, temperature, PLL mode or processor. When process is complete, the FMAX data for the system environment are characterized at step 39 and included with the tester models.

Once product FMAX data is collected on a given number of integrated circuits, both on a tester and in a system, that data can be analyzed to determine the system-to-tester offset model. Based on various products studied, in gathering system and tester data best results occur by sampling at least 15 to 20 processors per performance sort. At step 50 the system and tester FMAX data is input into the statistical software program. At step 52 a system-to-tester FMAX delta is calculated. This delta at step 54 is tested for best distribution type (typically, the distribution is Gaussian). Based on best distribution fit, at step 58 distribution parameters are calculated based on sample size and confidence selected at step 60 (for Gaussian distribution, population mean and standard deviation are estimated). For a Gaussian distribution, a t-distribution is used to estimate population mean and chi-squared distribution is used to estimate population standard deviation. These results are output to the Monte Carlo routine at step 62. This process is repeated through step 64 for each performance sort or system 56 under analysis until the process is completed at step 66.

Figure 6:
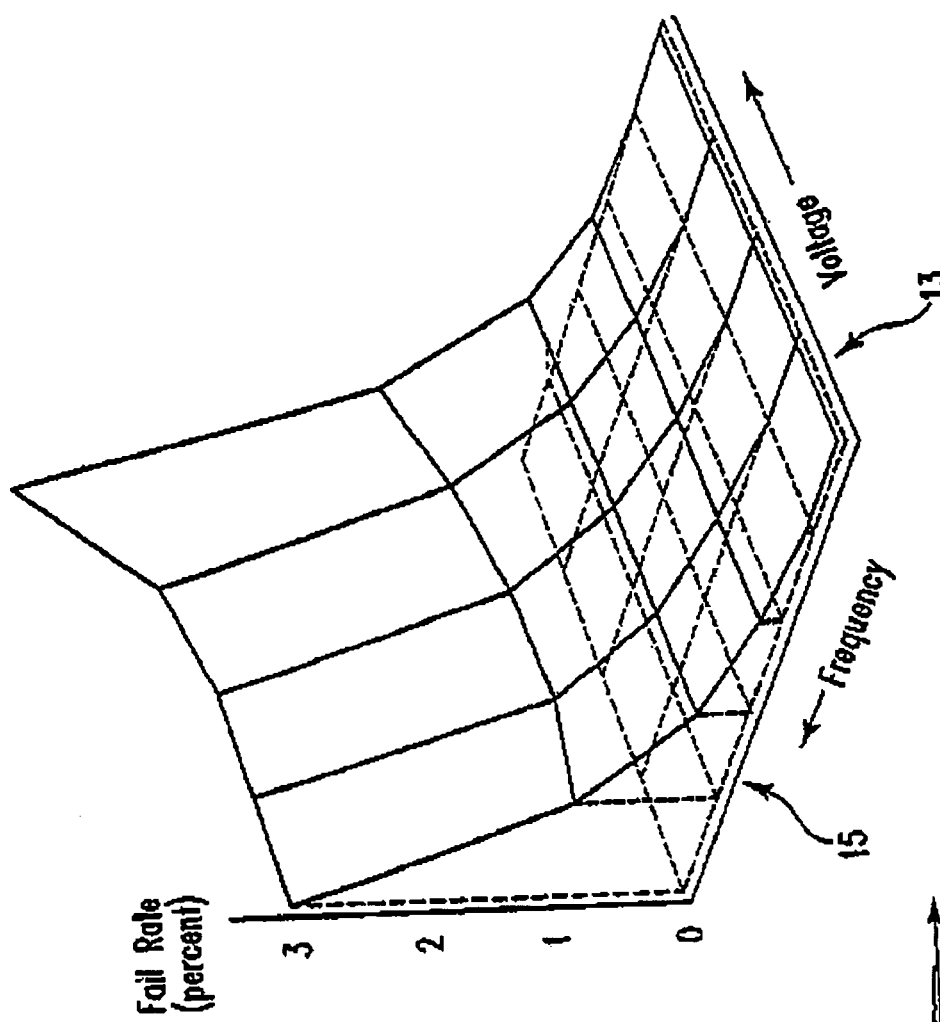
FIG. 6 is a graph illustrating the fail rates due to reliability effects.
Figure 5:
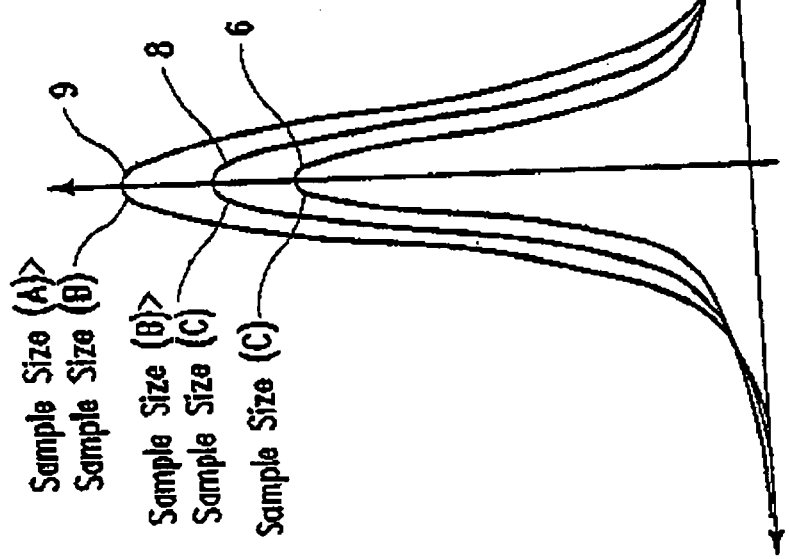
FIG. 5 is a graph illustrating the distribution of various sample sizes.

Reliability wearout mechanisms are estimated using both technology models and product specific data (power on hours, use voltage, use temperature, etc.). Depending on the wearout mechanism, different parameters will drive guardband. In the case of processor's hot electron (hot-e) degradation is an important specification. However, this technique could be extended to cover other reliability wearout mechanisms (i.e. SER, electromigration, etc.). A hot-e guardband model is developed using technology models (design manual equations, circuit models, etc.) and product specific variables such as operating voltage, operating temperature and average channel length per speed sort. This model predicts performance degradation at end of life. Hot-e is primarily driven by high voltage and short channel length. As illustrated in FIG. 6 fail rates increase on axis 15 with frequency (shorter channel lengths) and on axis 13 with voltage. This reliability data is characterized by the statistical software program to form a reliability model.

Figure 2:
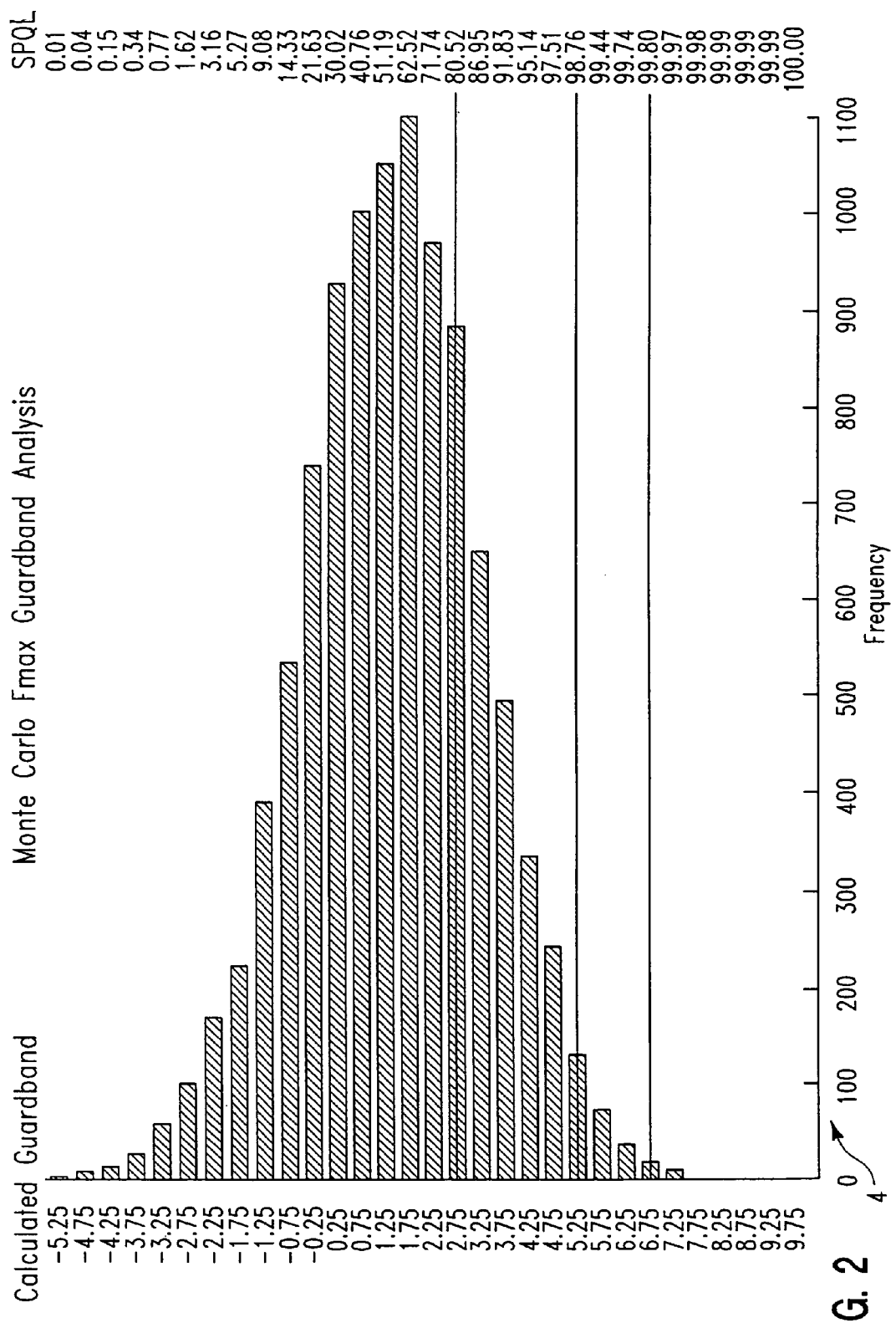
FIG. 2 is an example of the output which the guardband determines.
Figure 7:
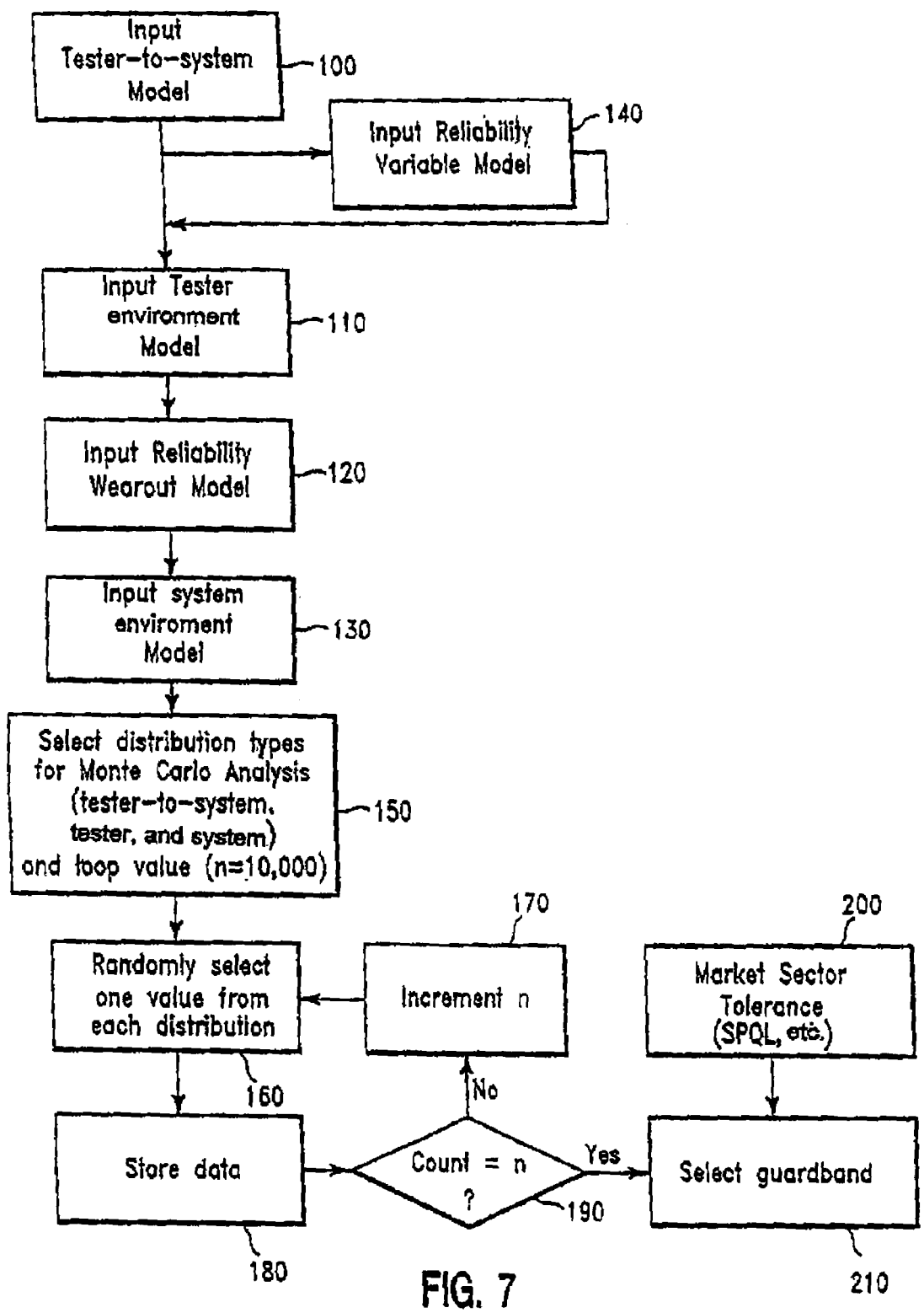
FIG. 7 is a flowchart illustrating the steps for determining a product guardband according to this invention.

As illustrated in FIG. 7 the models previously described as blocks 100, 110, 120, and 130 are inputs to the Monte Carlo analysis as well as market sector-quality (i.e. SPQL) expectations denoted as block 140. Each model is incorporated using the distribution type determined during the analysis previously described. A loop value is set (shown as 10,000, in block 150 but can be any relatively large number). Each model contributes a value at step 160 which is randomly selected based on distribution type. One guardband value is determined by combining the individual values and then adding hot-e input based on performance sort. This is repeated through steps 180, 190 and 170 until the loop value selected in block 150 is reached. The output is a distribution of guardbands based on all factors previously discussed. Finally, depending on market quality expectations input at block 200, a guardband can be selected at 210 which intelligently satisfies market tolerance expectations while minimizing yield loss (See FIG. 2). As can be seen from FIG. 2, trimming a few percent off a guardband, shown as vertical axis 4, to make yield targets without understanding the effects on product quality may adversely effect product quality. The opposite holds true as well. Over-guardbanding can lead to quality levels not required in the market which can in turn adversely affect yields and revenue.

As mentioned earlier any statistical software program can be used with the invention. SAS is used in the current implementation, but other programs are just as good (i.e. MATLAB, MATHCAD, etc.). One also uses these statistical software programs when determining the "critical specification" probability statistics. You also use the statistical software for running the Monte Carlo analysis for determining the final guardband.

Figure 8:
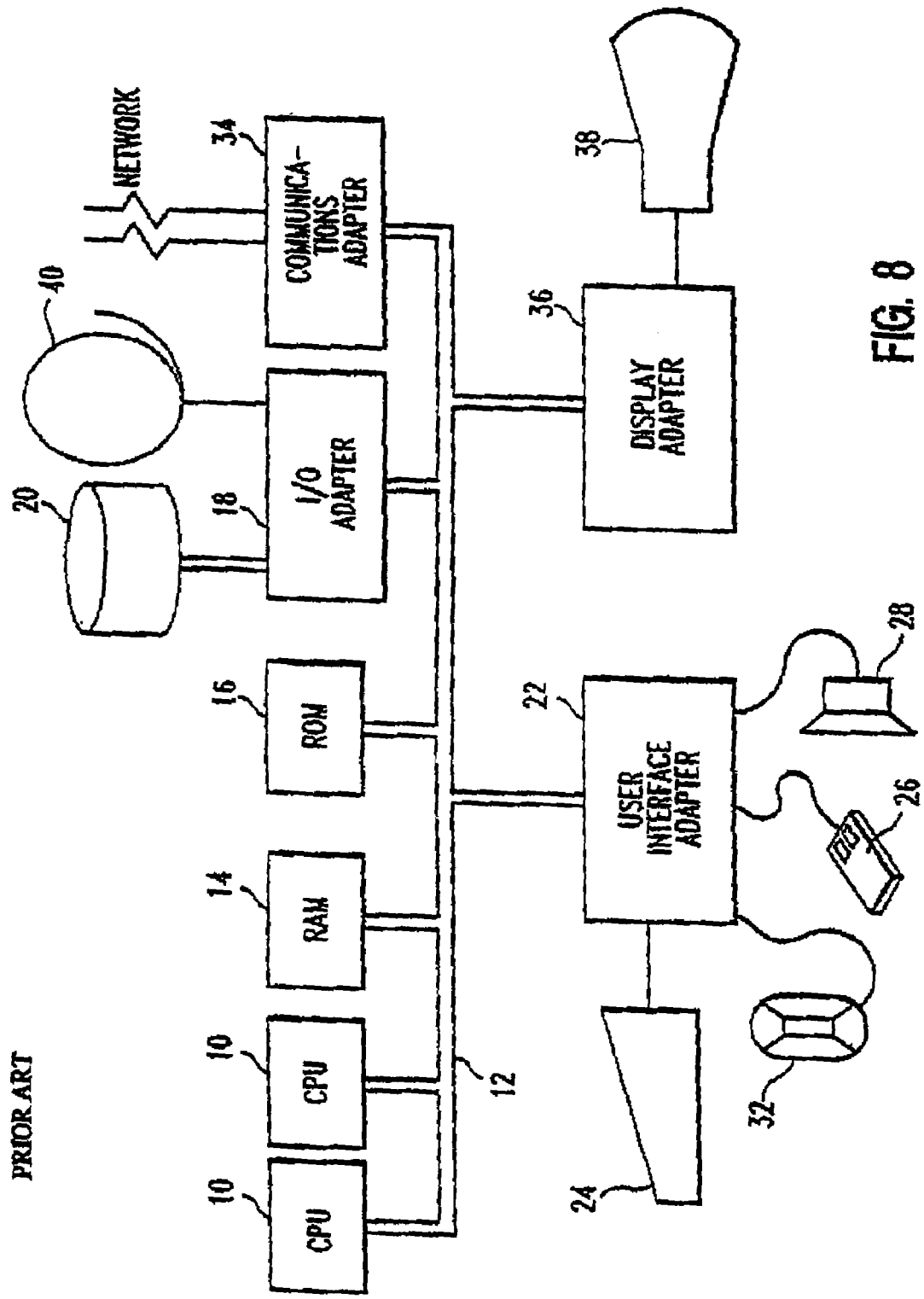
FIG. 8 is a diagram that illustrates the typical hardware system used in determining the guardband.

FIG. 8. illustrates the typical hardware configuration of a computer system capable of creating the test guardband in accordance with the subject invention. The configuration comprises at least one processor or central processing unit (CPU) 10. CPU(s) 10 is interconnected via system bus 12 to a random access memory (RAM) 14, read-only memory (ROM) 16, an input/output (I/O) adapter 18 for connecting peripheral devices such as disk units 20 and tape drives 40 containing a statistical program capable of doing statistical distribution analysis to bus 12, user interface adapter 22 for connecting keyboard 24, mouse 26, speaker 28, microphone 32, and/or other user interface devices such as touch screen device (not shown) to bus 12 for inputting data such as tolerance data, communication adapter 34 for connecting the information handling system to a data processing network and for inputting various environmental models into the computer the models, and display adapter 36 for connecting bus 12 to display device 38. The variable inputs shown on FIG. 7 and the SAS software are loaded on the appropriate disk or tape units or fed either through I/O adapters or the network for processing. A computer program with an appropriate application interface could be created by one of skill in the art and stored on the system to simplify the practicing of this invention.

Although this disclosure identifies a preferred embodiment, it should be noted this system could be easily extended to enable quantifiable business decisions which maximize revenue while not sacrificing quality when considering variables that affect products or process specifications by: implementing other analysis methods, including other variables that affect maximizing revenue while balancing risk and also applying this system to other applications within and outside the semiconductor industry.

What is claimed is:

1. A method for determining a specification guardband for a processor used in a system comprising the steps of:
   a) determining a set of variables representative of system environment, test environment, tester to system offset, and reliability, which affect the specification;
   b) creating a set of distribution models representative of variables that affect said specification, the set comprising models for the system on which the processor is used;

setting up the system environment;
   modeling system variables distributions during normal operation;
   setting initial system variables;
   booting the system at increasing frequencies until the system hangs;
   running system applications at a highest frequency at which the system functions and record such frequency;
   changing the initial system variables and performing on new system variables the steps of booting and running applied to the initial system variables;
   c) creating a distribution model for the system variables representative of the test environment comprising:
   characterizing electrical and mechanical test system parameters that affect the specification under test;
   choosing an appropriate distribution model for the test system parameters:
   d) creating a distribution model representative of tester to system offset comprising:
   inputting tester to system correlation data;
   calculating tester to system offset for a set of samples;
   choosing an appropriate distribution model for the tester to system offset;
   calculating tester to system mean and sigma based on the sample size;
   e) creating a reliability wearout distribution model;
   f) analyzing all the distribution models with a statistical tool that works with the distribution models; and
   g) selecting a guardband for said specification based on the statistical analysis and a tolerance target for the specification under analysis.

2. The method of claim 1 where system variable distributions are power supply voltage and operating temperature.

3. The method of claim 1 where the step of calculating the tester to system mean and sigma is applied to a different speed sort.

4. The method of claim 1 where the method of calculating tester to system mean and sigma is applied to a different system.

5. The method of claim 1 where tester system electrical parameters are tester timing accuracy, clock edge placement accuracy and tester power supply distributions.

6. The method of claim 1 where tester system mechanical parameters are device under test interface board, tester temperature and tester handler distributions.

* * * * *